United States Patent
Hougham et al.

(10) Patent No.: US 7,458,817 B2
(45) Date of Patent: Dec. 2, 2008

(54) LAND GRID ARRAY (LGA) INTERPOSER UTILIZING METAL-ON-ELASTOMER HEMI-TORUS AND OTHER MULTIPLE POINTS OF CONTACT GEOMETRIES

(75) Inventors: Gareth G. Hougham, Ossining, NY (US); Brian S. Beaman, Cary, NC (US); Evan G. Colgan, Chestnut Ridge, NY (US); Paul W. Coteus, Yorktown Heights, NY (US); Stefano S. Oggioni, Besana in Brianza (IT); Enrique Vargas, Bronx, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/865,321

(22) Filed: Oct. 1, 2007

(65) Prior Publication Data

US 2008/0020603 A1    Jan. 24, 2008

Related U.S. Application Data

(62) Division of application No. 11/365,366, filed on Mar. 1, 2006, now Pat. No. 7,331,796.

(60) Provisional application No. 60/715,261, filed on Sep. 8, 2005.

(51) Int. Cl.
    *H01R 12/00* (2006.01)
(52) U.S. Cl. ........................................ 439/66
(58) Field of Classification Search ............ 439/66, 439/74, 86, 91, 178, 591
    See application file for complete search history.

(56) References Cited

U.S. PATENT DOCUMENTS

| | | | |
|---|---|---|---|
| 5,071,359 A * | 12/1991 | Arnio et al. | 439/91 |
| 5,137,456 A | 8/1992 | Desai et al. | |
| 5,299,939 A | 4/1994 | Walker et al. | |
| 6,250,933 B1 | 6/2001 | Khoury et al. | |
| 6,293,810 B1 | 9/2001 | Goodwin et al. | |
| 6,442,039 B1 | 8/2002 | Schreiber | |
| 6,527,563 B2 | 3/2003 | Clayton | |
| 6,669,490 B1 | 12/2003 | DelPrete et al. | |
| 6,790,057 B2 | 9/2004 | DelPrete et al. | |
| 6,796,810 B2 | 9/2004 | DelPrete et al. | |
| 6,913,476 B2 | 7/2005 | Yean et al. | |
| 2002/0179325 A1 * | 12/2002 | DiStefano et al. | 174/256 |
| 2005/0106902 A1 | 5/2005 | Hougham et al. | |
| 2005/0124189 A1 | 6/2005 | Johnescu et al. | |
| 2008/0157361 A1 * | 7/2008 | Wood et al. | 257/738 |

* cited by examiner

*Primary Examiner*—Chandrika Prasad
(74) *Attorney, Agent, or Firm*—Scully, Scott, Murphy & Presser, P.C.; Daniel P. Morris, Esq.

(57) ABSTRACT

A land grid array (LGA) interposer structure, including an electrically insulating carrier plane, and at least one interposer mounted on a first surface of said carrier plane. The interposer possesses a hemi-toroidal configuration in transverse cross-section and is constituted of a dielectric elastomeric material. A plurality of electrically-conductive elements are arranged about the surface of the at least one hemi-toroidal interposer and extend radically inwardly and downwardly from an uppermost end thereof into electrical contact with at least one component located on an opposite side of the electrically insulating carrier plane.

5 Claims, 12 Drawing Sheets

FIG. 4
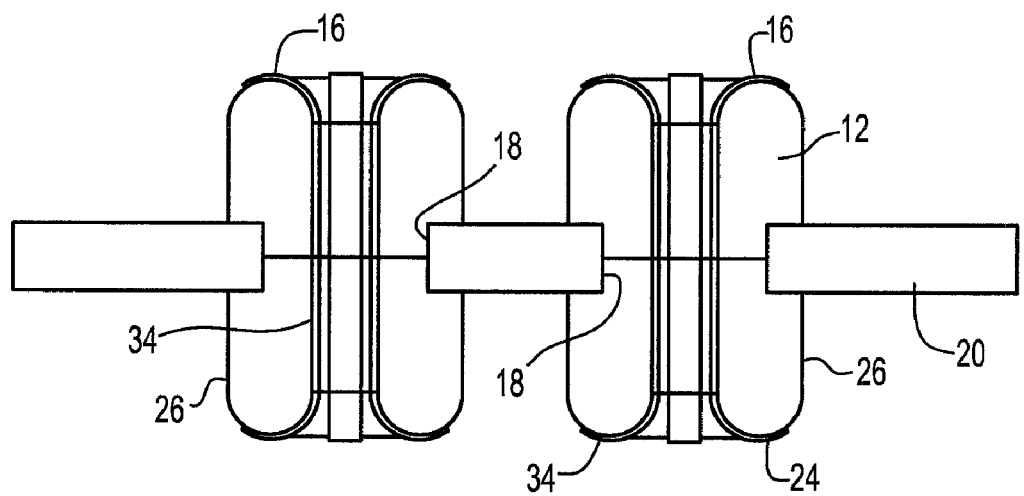
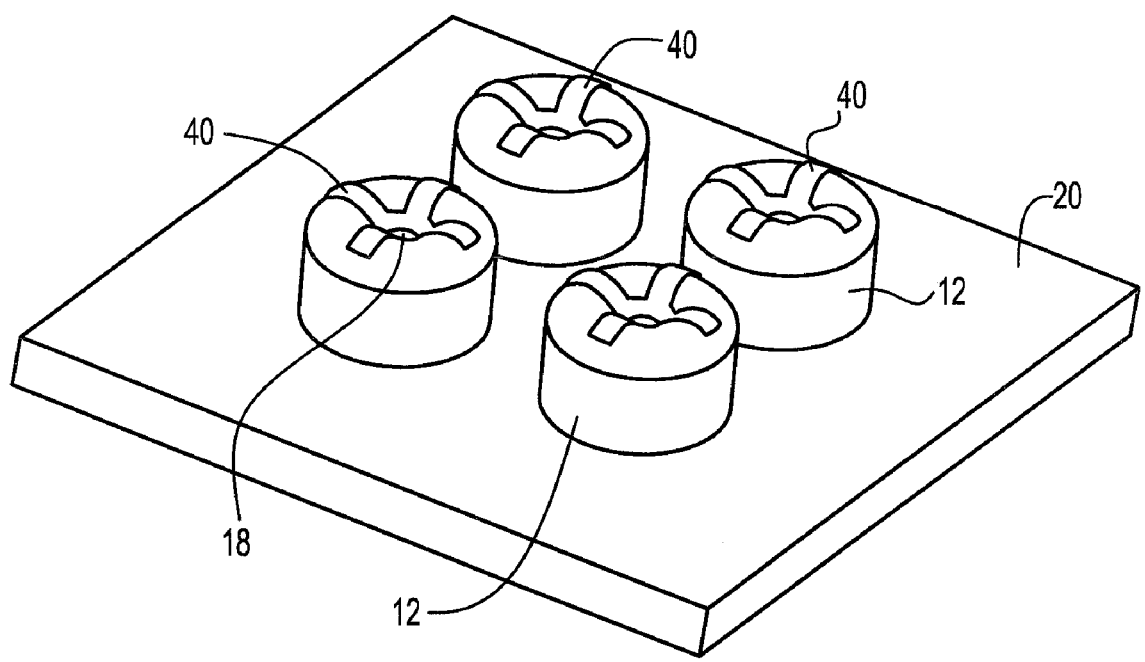
FIG. 5

LAND GRID ARRAY (LGA) INTERPOSER UTILIZING METAL-ON-ELASTOMER HEMI-TORUS AND OTHER MULTIPLE POINTS OF CONTACT GEOMETRIES

CROSS-REFERENCE TO RELATED APPLICATION

This is a divisional application of U.S. Ser. No. 11/365,366, filed Mar. 1, 2006, now U.S. Pat. No. 7,331,796, issued on Feb. 19, 2008, which claims benefit to U.S. Ser. No. 60/715,261, filed Sep. 8, 2005.

STATEMENT REGARDING FEDERALLY SPONSORED RESEARCH OR DEVELOPMENT

This invention was made with United States Government support under Contract No. NBCH3039004, DARPA, awarded by the Defense, Advanced Research Projects Agency, whereby the United States Government has certain rights in this invention.

BACKGROUND OF THE INVENTION

1. Field of the Invention

The present invention relates to the provision of novel and unique Land Grid Array (LGA) interposers, which incorporate the structure of metal-on-elastomer hemi-torus and other geometrically configured electric contacts to facilitate an array of interconnections between diverse electrical components.

Land Grid Array (LGA) interposers, by way of example, provide an array of interconnections between a printed wiring board (PWB) and a chip module, such as a Multi-Chip Module (MCM), among other kinds of electrical or electronic devices. LGA interposers allow connections to be made in a way which is reversible and do not require soldering as, for instance, in ball grid arrays and column grid arrays. Ball grid arrays are deemed to be somewhat unreliable on larger areas because the lateral thermal coefficients of expansion driven stresses that develop exceed the ball grid array strength. Column grid arrays hold together despite the stresses but are soldered solutions and, thus, do not allow for field replaceability, which is important because it saves the customer or user significant costs in the maintenance and upgrading of high-end computers for which LGAs are typically used.

2. Discussion of the Prior Art

The basic concept of utilizing LGA interposers to provide an array of electrical connections is well known in the technology. In this connection, reference may be made in particular to Hougham, et al., U.S. Patent Publication No. 2005/0106902 A1, which is commonly assigned to the assignee of this application, and the disclosure of which is incorporated herein by reference in its entirety. This publication describes LGA interposers which define structure consisting of metal-on-elastomer type electrical contacts, wherein a compliant contact consists of an elastomeric material structural element partially coated with an electrically conductive material, preferably such as a metal, so as to form the intended electrical contact. However, there is no disclosure nor suggestion of a compliant contact of an LGA interposer type providing multiple points of electrical contact for each gridpoint in a configuration, such as is uniquely provided by the present invention.

Johnescu, et al., U.S. Patent Publication No. 2005/0124189 A1 discloses an LGA-BGA (Land Grid Array-Ball Grid Array) connector housing and electrical contacts which, however, do not in any manner disclose the novel and inventive LGA interposer metal-on-elastomer structure as provided for herein.

Similarly, DelPrete, et al., U.S. Pat. Nos. 6,790,057 B2 and 6,796,810 B2; and Goodwin, et al., U.S. Pat. No. 6,293,810 B2, describe various types of elastomeric electrical contact systems and devices which, however, do not at all disclose the features and concept of the present inventive metal-on-elastomer LGA interposers and arrays pursuant to the present invention.

SUMMARY OF THE INVENTION

Metal-on-elastomer type LGA contacts, as described hereinabove, have been previously described in Hougham, et al. in which a compliant contact consists of a structural element of a non-conductive elastomer that is coated on a part of its surface with electrically conductive material, which resultingly forms the electrical connection. However, a compliant contact with multiple points of electrical contact for each gridpoint is only disclosed by the present invention, wherein several specific geometries and variants are also described. Among these, a hemi-torus shaped element, such as being similar in shape to one-half of a sliced donut in transverse cross-section) may be oriented concentrically with respect to a via (or proximate thereto), the latter of which passes through an insulating carrier plane to the other side thereof. Metal is deposited onto the external portions of the hemi-toroidal elastomer element in order to form a multiplicity of electrically conductive contacts.

There are two general instances of LGA interconnects made with hemi-toroidally shaped, or other kinds of structural contact elements constituted of elastomeric materials. In the first instance, holes or vias in an insulating carrier plane would first be filled with metal to form solid electrically conducting vias with a surrounding pad or dogbone pad. Onto these pads would be molded both top and bottom elastomeric LGA bodies possessing various shapes, for example, hemi-toroidal. Then in a final step, metal strips would be deposited from the via pad on each side up and over the apex or uppermost ridge of the elastomeric hemi-torus. As illustrated in the drawings, this would then form a continuous electrical path from the highest point on the top hemi-torus shape to the lowest point on the bottom hemi-torus shape at several points for an individual I/O.

In the second instance, the insulating carrier is initially unmetallized with open holes on the desired grid pitch. Then, the top and bottom elastomeric bodies, for instance, hemi-toruses are molded and metallization follows to form the electrically conducting path, as illustrated hereinbelow. In case that during molding, the open hole in the insulator were inadvertently (or purposely) filled with elastomer, (e.g. siloxane), this can be removed in a controlled fashion by a coring or punch step to open a continuous pathway from the top surface to the bottom surface. Metallization can then be deposited on the exposed surface, which is produced thereby in a desired pattern so as to form the electrically conductive pathway.

In addition to the standard two-sided LGA interposer, i.e., on both sides of an insulating carrier phone, a one-sided compliant contact is also generally known in the art, and referred to as a "hybrid" LGA in which the contacts are soldered (ball-grid-array or BGA) to the circuit board but form a compression connection with the module, as in Johnescu, et al., this frequently being referred to as a "hybrid BGA/LGA" or a "hybrid LGA/BGA" interposer.

There are several types of hybrid BGA/LGA's commercially available; however, the present invention describes a new type of hybrid BGA/LGA combining a metal-on-elastomer hemi-toroidally shaped top or upper contact with a solderable (BGA) bottom or lower contact. This provides significant advantages over existing technologies, and examples thereof are presented hereinbelow.

In one preferred embodiment, an insulating carrier plane with regularly spaced through-holes is treated to create a metal pad on top to fill the holes with electrically conducting metal for a through via, and a bottom surface, for example, by electroplating followed by photolithography. This produces a bottom surface with a pad for a BGA connecting to a circuit board. Then molded onto the top surface is a hemi-toroidal shape of an elastomeric material, such as siloxane rubber. The hemi-torus is located concentric to the metal via pad and surrounds it either fully or partly so that the elastomeric inside edge of the hemi-torus either touches the metal via and pad or lies outside the boundary of the via and pad. Then, metal is deposited to form a path of a continuous electrical connection leading from the top of the elastomer hemi-torus to the pad, which connects to the electrically conducting via to the bottom side of the insulating carrier plane creating a continuous conductive pathway from top to bottom. The metal on the elastomer may be distributed over the entire surface, or fabricated to consist of one or more strips connecting the top of the hemi-torus to the via pad. In a preferred embodiment there can be employed three strips, separated by 60 degrees from one another, although other quantities and spacing are shown herein. All of the strips start at the top of the torus, or slightly on the outside edge, and terminate on the pad in the center, this then providing multiple contact points, which is deemed electrically desirable.

Entrapment of air in the center of the hemi-torus is of concern as it could interfere with reliable seating of the electrical contact in compression. This potential concern can be mitigated by forming an opening or venting slit in the side of the torus during or after molding. Alternatively, any concern about entrapped air can be overcome by making the metal strips which extend over the top of the hemi-torus thick enough to extend over the elastomer surface, so that the gap produced between the uncoated area of the hemi-torus and the module bottom when the metal is in contact with the module bottom provides sufficient venting to allow a facile escape of air from the center of the hemi-torus upon actuation.

Another advantage to having multiple discontinuities in the hemi-torus shape resides in that each segment with its metal strip contact can move independently and better accommodate or compensate for non-uniformities in the mating surfaces.

The hemi-toroidal shape of the interposer can be molded from a compliant (rubbery) material onto each I/O position in an array, and metal strips are fabricated on the top surface of this shape so that they will provide multiple electrical pathways from a single chip module pad to a single printed circuit board pad. When this compliant hemi-torus is thus metalized, and preferably provided with discontinuities in the donut wall so that air would not be trapped preventing good contact, and provided that the compliant button stays well adhered to the insulating substrate or plane by virtue of anchoring holes, surface roughening, or surface treatments or coatings, then a uniquely functioning LGA is readily produced.

A structure pursuant to the invention possesses another advantage. For modules or PCBs that have solder balls or other protruding conductive structures, the LGA interposer array can be actuated into the module/PCB sandwich without the need for any separate alignment step or alignment structures. The ball will nest in the hemi-torus structure and center and stabilize itself with respect to any lateral motion in the x-y directions.

This provides another advantage which may sometimes be invoked, in that a module, which has had solder balls attached thereto, it in preparation for an ordinary BGA solder reflow step could instead be redirected on the assembly line for utilization in an LGA socket. Thus, a single product number part (balled module) could be used in two separate applications: 1) BGA soldering and 2) LGA socketing.

Such torus structures could be made by molding where the molds are made by drilling or machining with a router-like bit. Alternatively, it could be made by chemically or photo-etching of the mold material utilizing a mask in the shape of a torus structure. The mask could be made by photolithography directly on the mold die or could consist of a premade physical mask (such as from molybdenum sheet metal) that was separately formed by photolithography and then applied to the mold die.

Another embodiment of this invention utilizes a hemi-torus that has been divided into three or four sections, each of which have been metalized to provide separate electrical paths, and whereby each section can respond mechanically independently when contacted with a pad or solder ball and can thus more reliably form a joint. Moreover, preferably a small space between these sections is created to allow gas to escape freely.

Pursuant to yet another embodiment, a number of the divided sections of a single hemi-torus can be made taller to provide a lateral stop for the case when a balled module is loaded preferably from one side thereof.

According to another embodiment, a wall shape of the sectionally-divided hemi-torus curves back in and under to form a nest so that when a solder ball is brought into contact therewith, it can be pressed down into the nest and snapped into place, or the shape could be curved simply to best nest a solder ball held in place there against.

As described in another embodiment, the I/O consists of multiple hemi-toroidal conic sections or domes that are fabricated into a group to service a single I/O. Each of these domes is metalized separately so that when contact is made with a module pad, redundant electrical paths are formed. The different contacts can also act independently mechanically thus being better able to accommodate local non-uniformities. A further modification would be to make a portion of the hemi-toroidal domes in such a group higher in the z-direction, thus providing a mechanical stop for cases where a balled module is loaded in part from one side, and thus able to constitute an alignment feature.

In the above embodiments, the structures and methods described can be applied to either single sided compliant LGAs (aka hybrid LGA), i.e., on one side of the carrier plane only, or to double sided LGAs. Further, they can be applied to hybrid cases where the corresponding metal pad is either directly in line with the center axis of the upper contact or may be offset therefrom:

As shown in another embodiment, the compliant structures are in a linear form rather than based on a torus or groups of domes. From a linear compliant bar, or alternatively a sectioned bar, multiple contact strips can be formed for each I/O. Further, the multiple metal contact strips could be located on different linear bars for a given I/O. Various arrangements could include multiple metal strips on the same linear section of compliant material, or on different adjacent linear bars in a line, or on different linear bars on either side of the central I/O via.

BRIEF DESCRIPTION OF THE DRAWINGS

Reference may now be made to the following detailed description of preferred embodiments of the invention, taken in conjunction with the accompanying drawings; in which:

FIG. 4 illustrates a transverse enlarged cross-sectional view of the LGA interposers of FIG. 3;

FIG. 5 illustrates a perspective view of a further embodiment of an LGA interposer array;

DETAILED DESCRIPTION OF THE INVENTION

Figure 1:
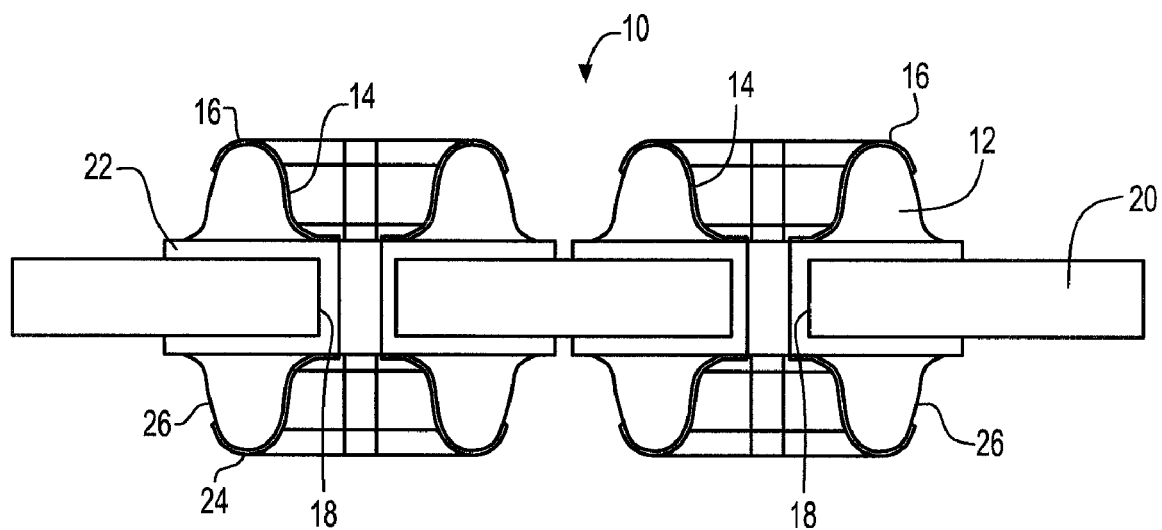
FIG. 1 illustrates generally diagrammatically, a metal-on-elastomer LGA interposer array, shown in a transverse sectional view, pursuant to a first embodiment of the invention.

In the detailed description of the various embodiments, elements or components, which are substantially similar or identical, are designated with the same reference numerals.

Referring to the embodiment of the metal-on-elastomer LGA interposer array 10, as illustrated in FIG. 1 of the drawings, there are shown a plurality of the interposers 12 in the form of hemi-toroidally shaped elements or so called buttons (generally simulating the shape of a transversely sliced donut). Each of the LGA interposer buttons 12 includes a plurality of circumferentially spaced flexible strip-like metal elements 14 forming electrical contacts which reach from the topmost surface 16 of each respective LGA button 12 to the via 18 which extends through an insulating carrier pad 20 on which the LGA interposer buttons are mounted, and down through the center of the LGA buttons so as to connect to a conductive pad 22 which surrounds through the through via on both sides of the carrier 20, and extends out along the insulating carrier surface beneath the LGA so as to make electrical contact at the other side or the lowermost end surface 24 of the inversely positioned lower LGA interposer buttons 26. The electrically-conductive flexible metal elements are primarily strips 14 which extend from the uppermost end of the respective upper LGA interposer buttons 12 inwardly into an essentially cup shaped portion extending to the hole or via 18 formed in the pad 22.

Consequently, by means of the pads 22, which are constituted of electrically conductive material or metal and which surround each of the through vias 18 formed in the dielectric material insulating carrier plane 20, these contact the ends of each of the metal strips 14, which extend along the external elastomeric material surface of each respective LGA hemi-toroidally shaped interposer structure or button 12. Accordingly, electrical contact is made from the uppermost or top end of each respective LGA interposer button to the lowermost end 24 of each of the opposite sided LGA interposer buttons 26 at the opposite or lower side of the insulating carrier plane 20.

Figure 2A:
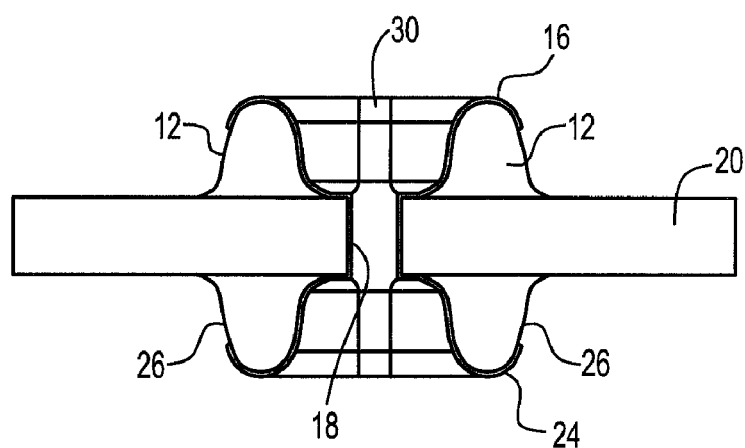
FIG. 2A illustrates a modified embodiment of the metal-on-elastomer LGA interposers, shown in a transverse enlarged sectional view.

With regard to the embodiment illustrated in FIG. 2A of the drawings, wherein the electrical elements 30 consisting of the strips positioned on the top surface 16 of the respective LGA interposer buttons 12 extend towards the through via 18, in this instance, there is no electrically conductive pad present as in FIG. 1, but rather the metallic or electrically conductive strips 30 forming the flexible metal contacts extend from the uppermost end 16 of the upper LGA interposer buttons 12 down through the via 18, the insulating carrier plane 20 to the lowermost ends or apices 24 of the lower inverted LGA buttons 26 on the opposite or bottom side of the structure 10.

Figure 2B:
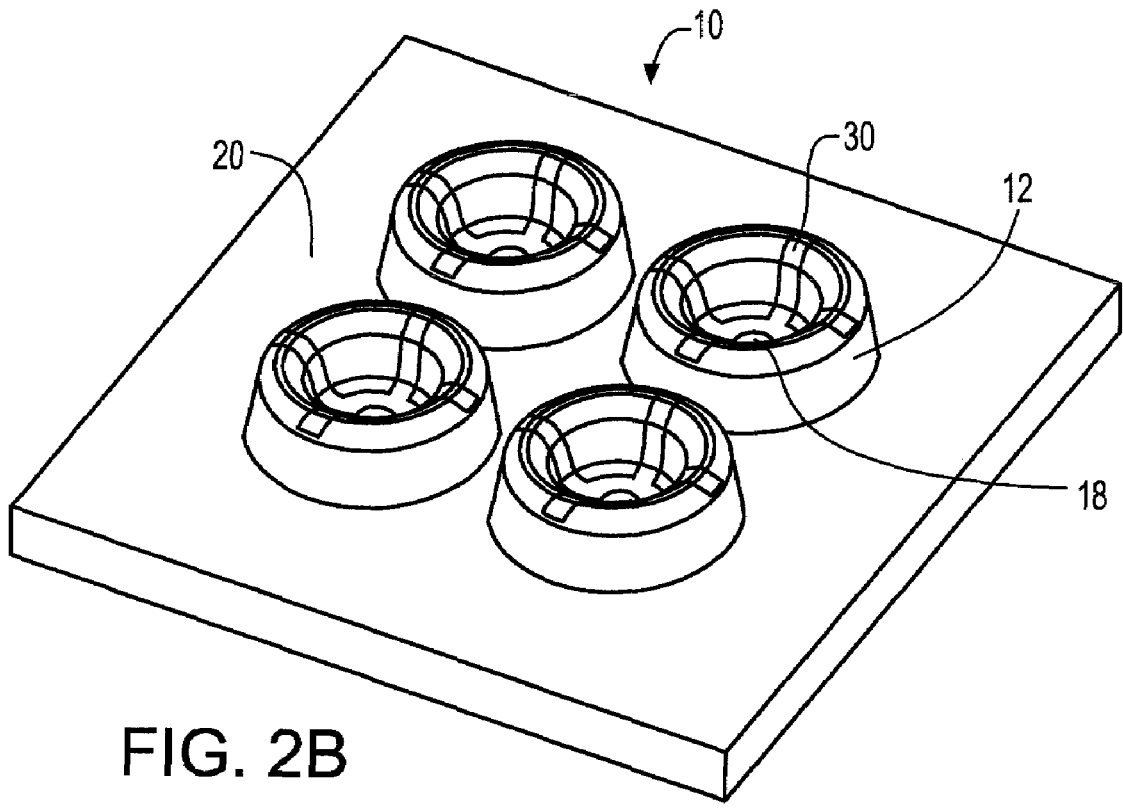
FIG. 2B illustrates a perspective view of the LGA interposer array of FIG. 2A.

In essence, in both embodiments, in FIGS. 1 and 2A, both the upper and lower LGA interposer buttons 12, 26 are mirror images and are symmetrical relative to each other on opposite sides of the insulating carrier plane 20. With regard to FIG. 2B of the drawings, this illustrates primarily a perspective representation of the array of the upper LGA interposer buttons 12 positioned on the insulating carrier plane 20.

Figure 3:
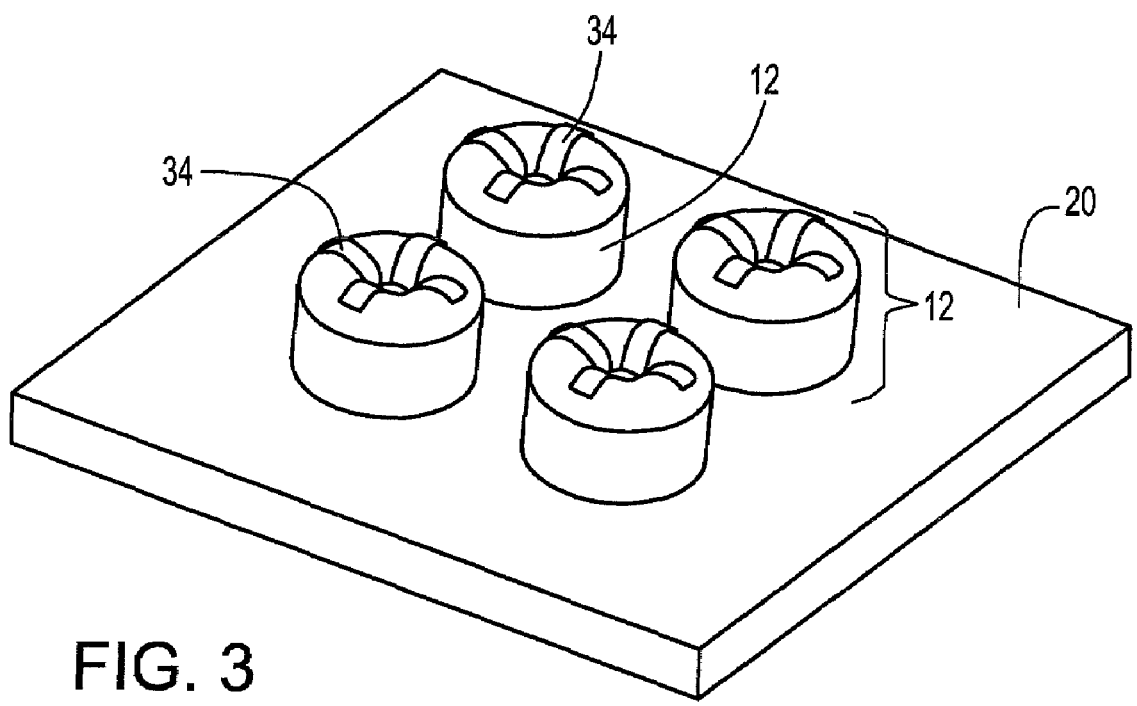
FIG. 3 illustrates a perspective view of metal-on-elastomer LGA interposers.

Reverting to the embodiment of FIG. 3 of the drawings, in this instance, the flexible metal electrical contacts 34, which are positioned so as to extend from the upper ends 16 of each of the respective LGA interposer buttons 12 through the via 18 in the insulating carrier plane 20, as also represented in the cross-sectional view of FIG. 4, are designed to have the electrical metal contacts forming a plurality of flexible strips 34, which extend each unitarily from the upper ends 16 to the lower ends 24 of the hemi-torus shaped buttons 12, 26 from above and below the insulating carrier plane 20 in a mirror-image arrangement. Hereby, the multiple, circumferentially spaced metal electrical contact strips 34 extend from the uppermost point on one side of the insulating plane to the lowermost point on the opposite side so as to form electrical through-connections at both upper and lower ends and, in effect, forming a reversible structure 10.

Figure 6:
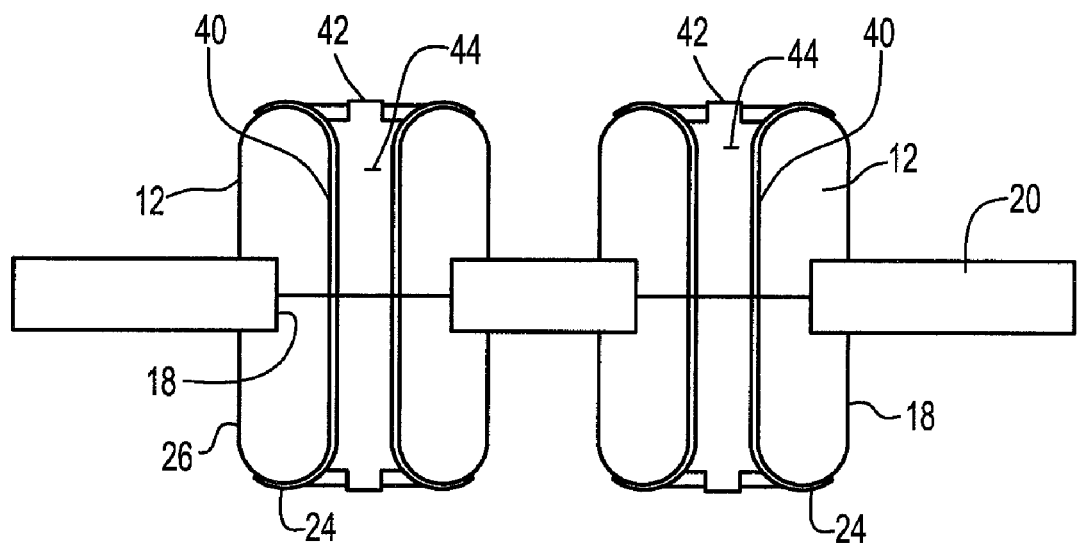
FIG. 6 illustrates a transverse enlarged cross-sectional view of the interposer array of FIG. 5.

As shown in FIG. 5 of the drawings, in that instance, each of the hemi-toroidally shaped interposer buttons 12, 26, which are essentially identical in construction with those shown in FIGS. 3 and 4 of the drawings, have the metal contacts 40 formed so that they extend in a common annular conductive sleeve structure 42 prior to continuing through the via 18, which is formed in the insulating carrier plane 20 to the upper and lower ends 16, 26 of the LGA interposer buttons 24. In FIG. 6 of the drawings, these contacts 40 separate only into separated strip-like portions 42 at the extreme uppermost and lowermost ends of the LGA interposer buttons 12, 26 and then join together into the essentially annular structure 44 extending through the via 18 formed in the insulating carrier plane 20.

Figure 7:
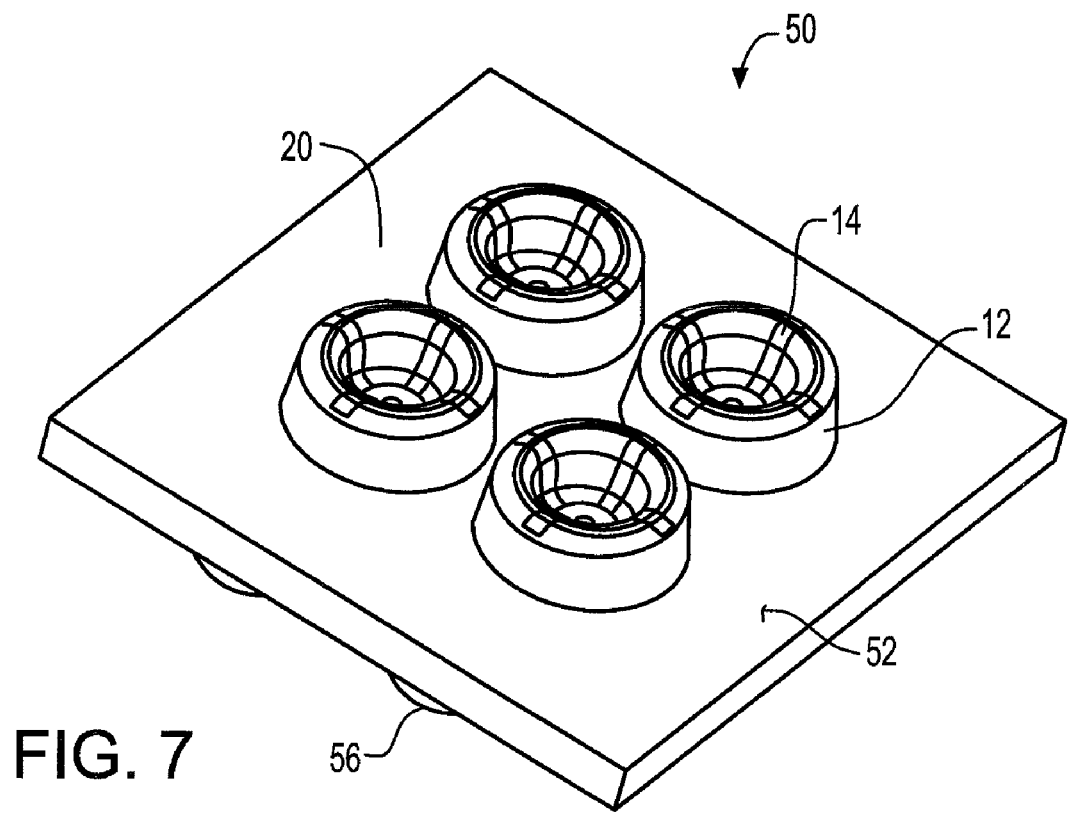
FIG. 7 illustrates a perspective view of a further embodiment of a metal-on-elastomer LGA interposer array.
Figure 8:
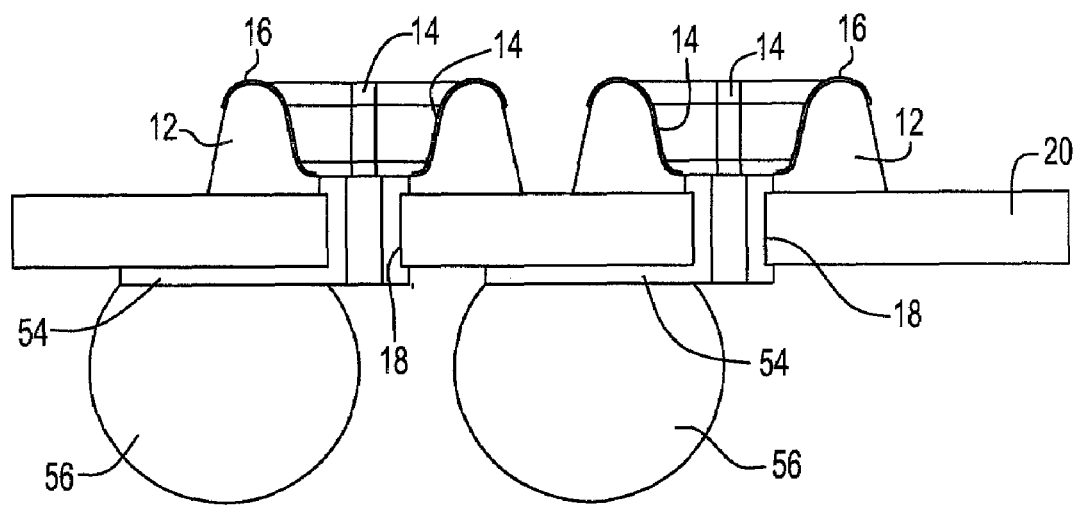
FIG. 8 illustrates a transverse enlarged cross-sectional view of the LGA interposer array of FIG. 7.

Referring to the embodiment of FIGS. 7 and 8 of the drawings, these illustrate essentially a structure 50 wherein LGA interposer buttons 12 are arranged only on the upper surface 52 of the insulating carrier plane 20 in a manner similar to FIG. 1 of the drawings, and wherein the conductive strips 14 contact metallic or electrically-conductive pads 54 extending respectively through each of the through vias 18 formed in the insulating carrier plane 20. The lower surface of each metal pad 54, in turn, may have a solder ball 56 attached thereto in preparation for a subsequent joining, as is known in the technology.

Figure 9:
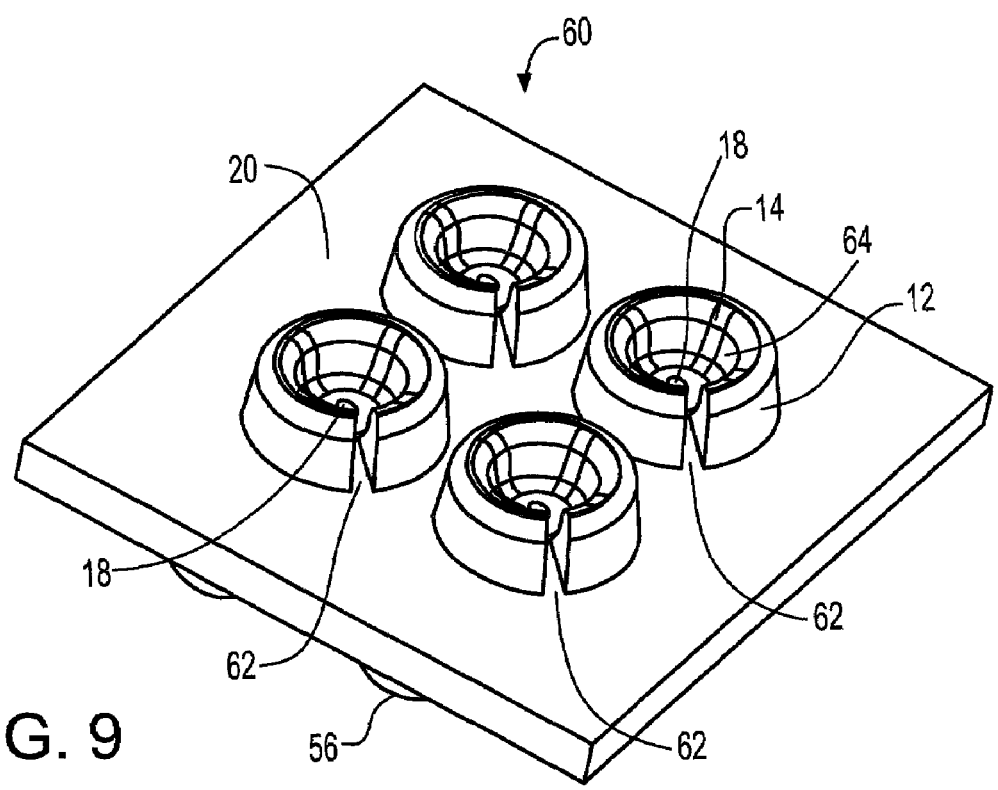
FIG. 9 illustrates a perspective view of a still further embodiment of a metal-on-elastomer LGA interposer array.

As shown in the perspective representation of FIG. 9 of the drawings, in that instance, the LGA interposer array structure 60, which is mounted on the insulating carrier plane 20, is similar to that shown in FIGS. 7 and 8 of the drawings; however, a slit 62 is formed in the elastomeric material of each LGA interposer button 12, communicating with the interior 64 thereof, and with the through via 18, which is formed in the insulating carrier plane 20, so as to enable any gasses or pressure generated to vent from the interior thereof to the surroundings.

Figure 10:
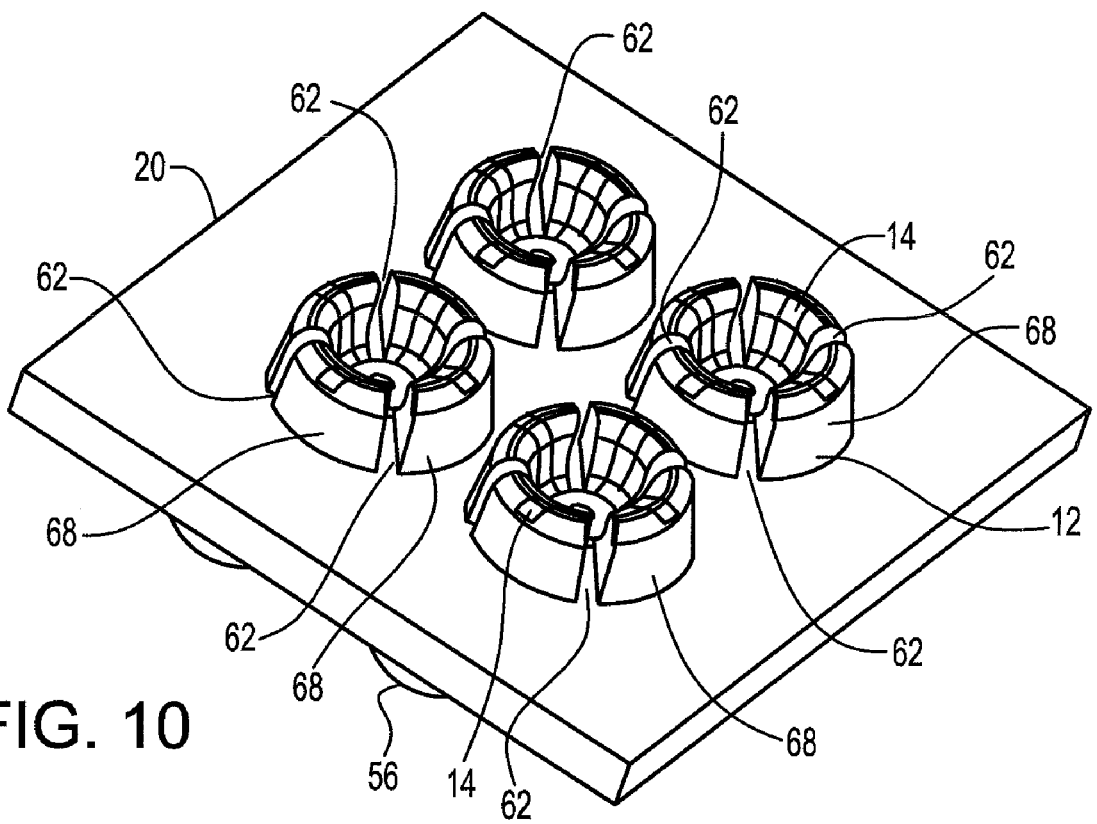
FIG. 10 illustrates a perspective view of a further embodiment of an LGA interposer array, which is similar to that illustrated in FIG. 7.

FIG. 10 of the drawings is also similar to the structure shown in FIG. 7, however, in this instance, each elastomeric interposer button 12 has a plurality of slits 62 or discontinuities formed in the annular toroidally-shaped walls thereof, preferably intermediate respective flexible metal strips 14, which are located on the upper and inward downwardly extending surface of each elastomer buttons, so as to enable each separate segment 68 to be able to resiliently or flexibly respond to changes or irregularities in the topography of elements contacting the LGA interposer buttons 12. Also, each segment 68 between each of respective metal contact strips 14 may respond mechanically or independently, so as not to only accommodate differences in topography with a mating surface or differences in the shape of mating solder balls, but in cases where a solder ball will be pressed against the toroidal contacts to produce an electrical connection. In effect, this will enable a mechanical or physical compensation for encountered differences in contact surfaces.

Figure 11:
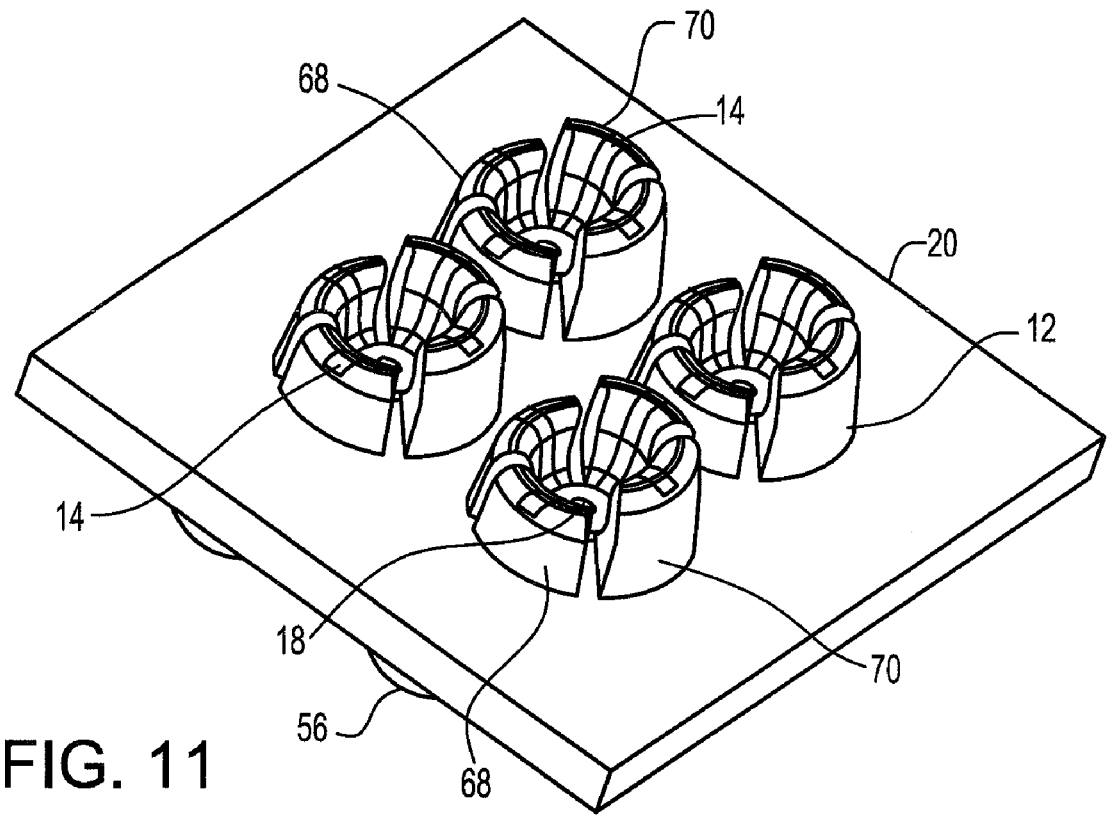
FIG. 11 illustrates a further embodiment in a perspective view of an LGA interposer array showing a modification relative to that shown in FIG. 10.

With regard to the embodiment of FIG. 11 of the drawings, which is somewhat similar to FIG. 10, in that instance, at least one or more of the segments 68, which are separated by the intermediate slits extending through the LGA interposer buttons are different in height, so as to have some of the segments 70 higher than others in a z- or vertical direction relative to the plane of the insulating carrier plane 20. In this instance, two segments 68 of the four independent segments of each respective LGA interposer button 12 are shown to be lower in height than the other segments 70.

Figure 12:
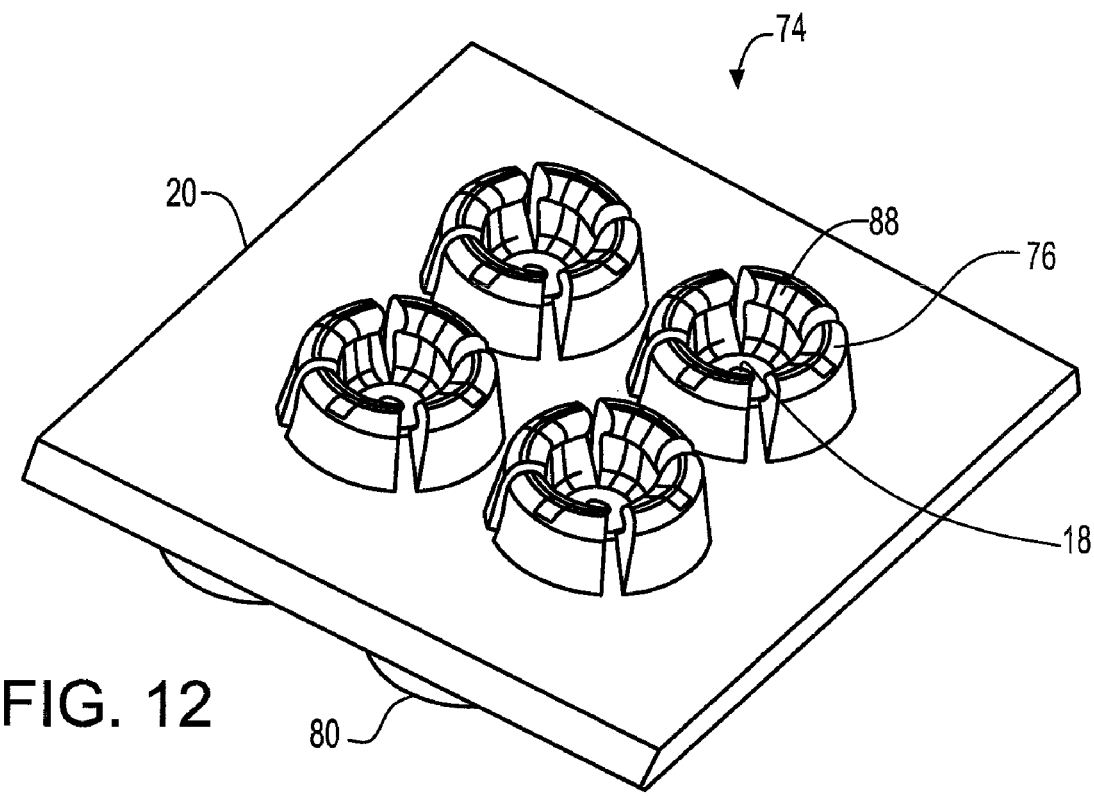
FIG. 12 illustrates a perspective representation of a further LGA interposer array, which is somewhat similar to that of FIG. 10.
Figure 13:
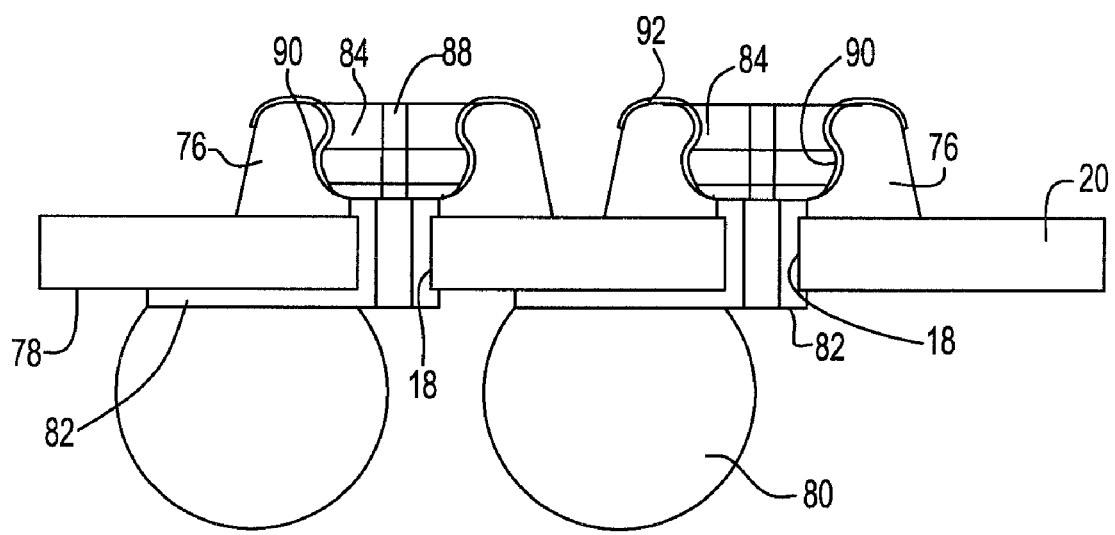
FIG. 13 illustrates a transverse enlarged cross-sectional view of the LGA interposer array of FIG. 12.

With regard to FIG. 12 of the drawings, in this instance, the array structure 74 of the hemi-toroidal LGA interposer buttons 76, which are mounted on the insulating carrier plane 20, the opposite or lower side 78 of which has solder balls 80 connected to electrically-conductive pads 82 extending through the vias 18, has the centers 84 of the respective LGA interposer buttons 76, which have electrical strip-like contacts 88 extending downwardly, as shown in FIG. 13, have a contoured inner wall configuration 90, which allows for nesting or a snap-fit with a solder ball (not shown), which may be brought into engagement therewith. In this instance, FIG. 13 showing the cross-sectional representation of FIG. 12, illustrates the knob-shaped interior sidewall profile 90 of the compliant interposer button with the separate metal contact strips 88 extending upwardly along the interior of wall 90 to the topmost end 92 of each respective LGA interposer button 76.

Figure 14:
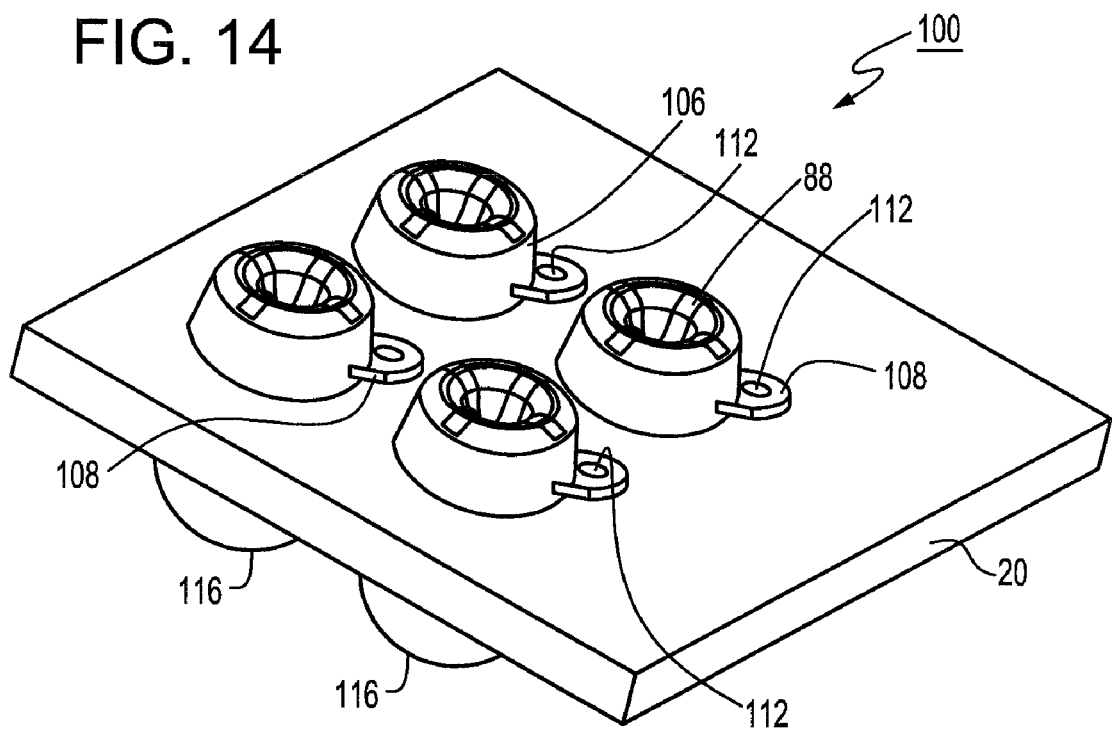
FIG. 14 illustrates a perspective view of a further embodiment of an LGA interposer array.
Figure 15:
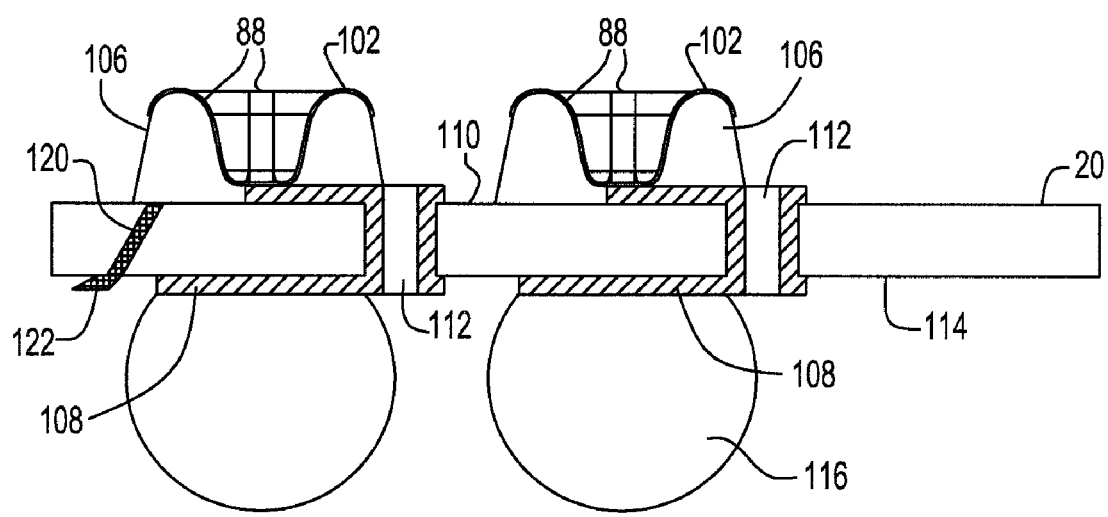
FIG. 15 illustrates a transverse enlarged cross-sectional view of a portion of the LGA interposer array of FIG. 14.

As illustrated in the embodiment of FIG. 14 of the drawings, in this instance, as also shown in cross-section in FIG. 15; multiple metal strip contacts 88 extend from the top surfaces of the compliant LGA button structure 110, passing over the top surfaces 102 and extending down into the center part of the hole 104 provided in each interposer button 106, and meeting with a common pad-shaped metal conductor 108, which extends along the upper surface 110 of the insulating carrier plane 20 under the button in contact with strips 88 and outwardly until reaching a via 112, which extends the metal pad downwardly through the insulating carrier plane 20 and along the lower surface 114 thereof, so as to contact solder balls 116. This is illustrated in the cross-sectional representation of FIG. 15 of the drawings, which also shows a filled injection tube 120 extending through the insulating carrier plane 20 and a residue break off point 122, where an elastomer portion was separated from an injection port on a mold forming the entire LGA button structure. This embodiment, showing the filled injection tube for the plastic material, is adapted for the method in which the injection molding of elastomeric material is implemented from the bottom side of the insulating carrier plane 20.

Figure 16:
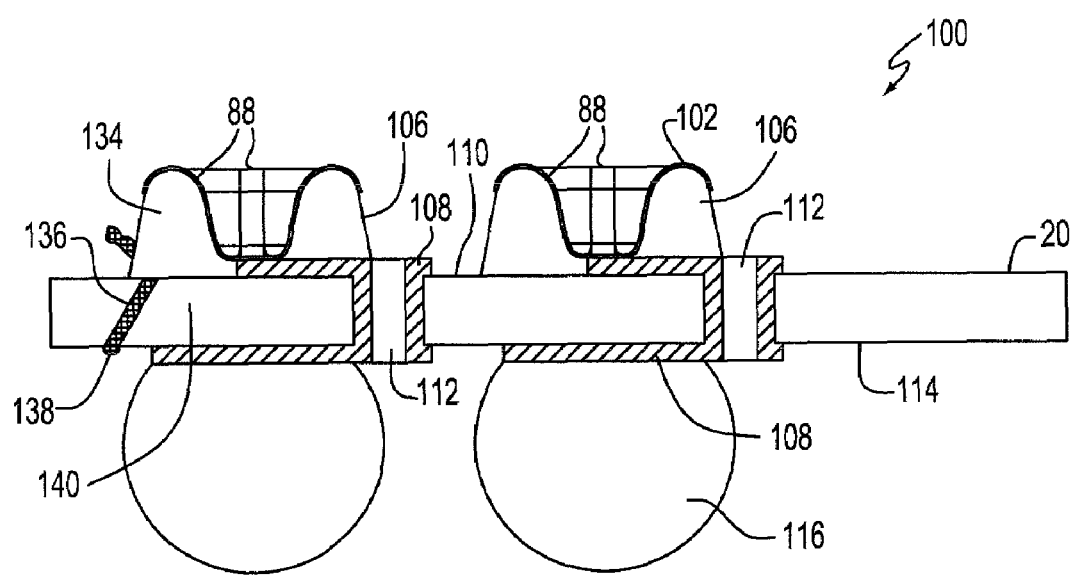
FIG. 16 illustrates a transverse enlarged cross-sectional view of an embodiment which is somewhat similar to that of FIG. 14.

As shown in FIG. 16 of the drawings, which is essentially similar to the embodiment of FIG. 15, in that instance, this illustrates a filler injection tube, the mold (not shown) forming the LGA button structure is implemented by injection molding from the top side of the mold, and a residual mass of elastomer 132 can be ascertained extending from the side 134 of the elastic LGA button structure 100 from which it was separated at the injection port of a mold.

Also indicated in FIG. 16 are two types of anchoring holes in the insulating carrier plane 20, wherein one hole 136 extends all the way through to the other side thereof, and wherein a blob 138 of residual excess molding material penetrates slightly beyond the bottom surface of the insulating carrier plane 20. Another type of anchoring hole or cavity 140 does not extend fully through the insulating carrier plane 20, but is formed as a depression in the top surface of the latter, so as to mechanically anchor the elastomeric material of each LGA interposer button to the structure or plane 20.

Figure 17:
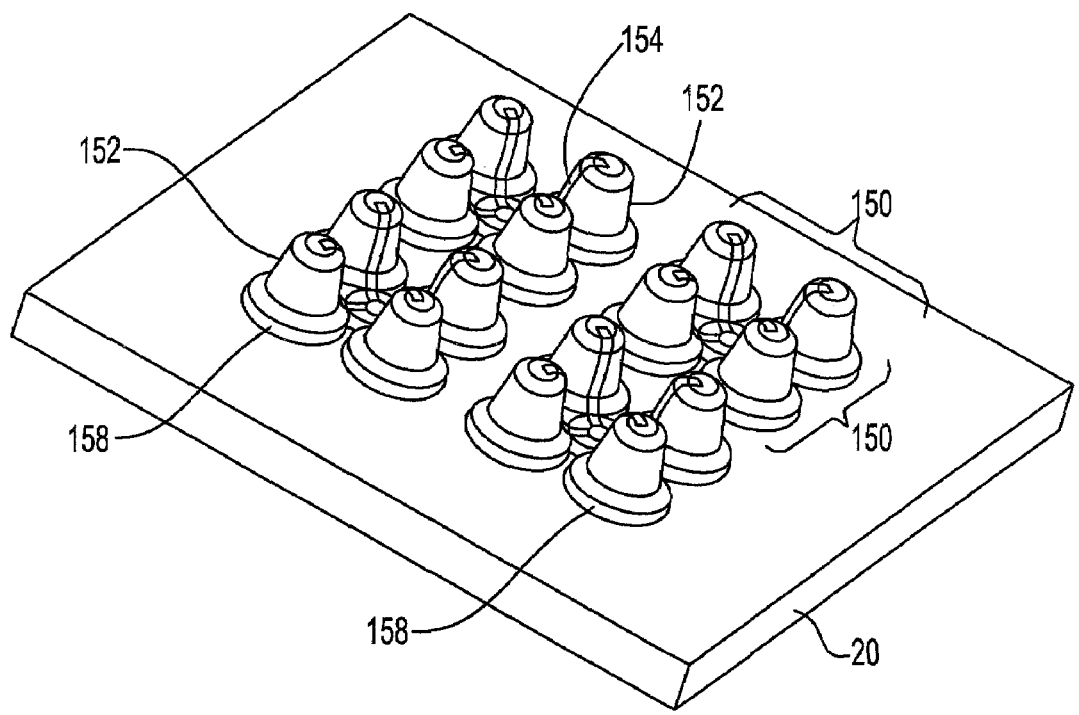
FIG. 17 illustrates a perspective view of a further embodiment of an LGA interposer array.
Figure 18:
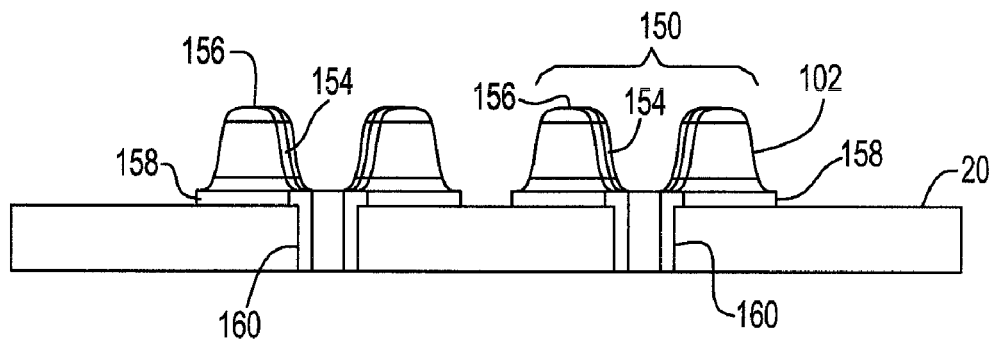
FIG. 18 illustrates a transverse enlarged cross-sectional view of the LGA interposer array of FIG. 17.

Reverting to the embodiment of FIGS. 17 and 18 of the drawings, these show another aspect of providing an LGA interposer array 150 on an insulating carrier plane 20, wherein a multiple of LGA interposer buttons 152 of essentially conical configurations and their electrical metallic strip contacts 154, which extend over the topmost ends 156 thereof, service a common I/O electrical contact 158 in the form of a pad on the upper surface of plane 20. In this instance, the structure incorporates an electrically conductive via 160 extending through the insulating carrier plane 20, shown in a center of a group of four LGA interposer buttons 102, as a common meeting point of the metal contact strips 154 on pad 158, which extend from respectively one each of the top of each LGA button down the side thereof and into the via metallurgy of the structure, towards the bottom of plane 20, as shown in cross-section in FIG. 18 of the drawings.

Figure 19:
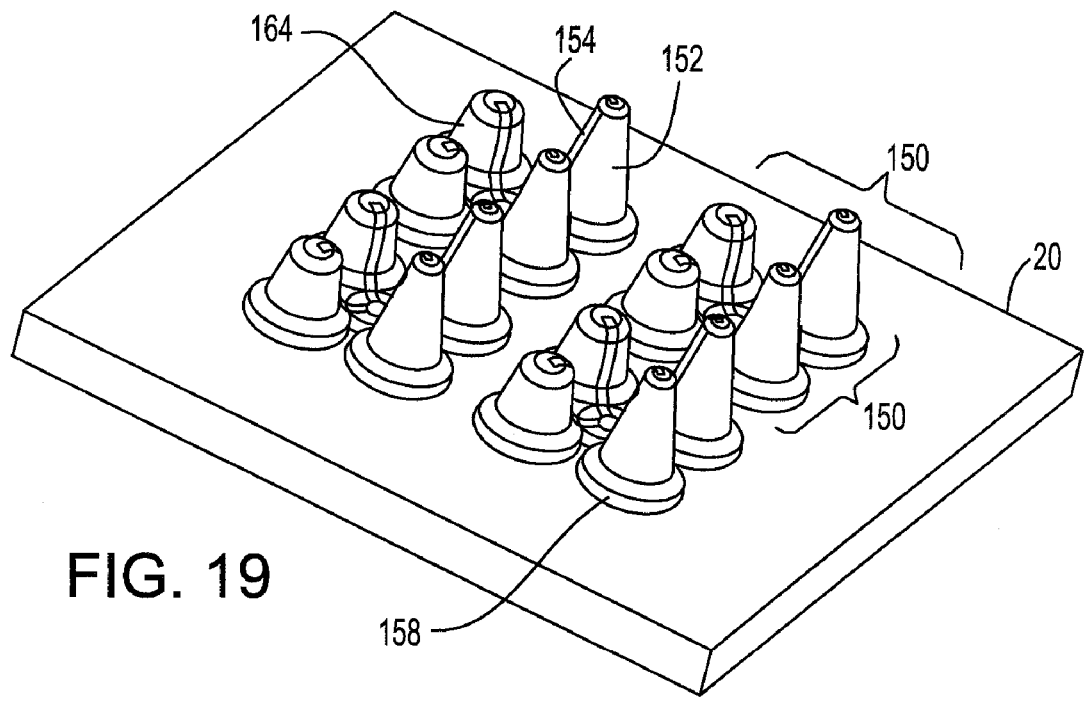
FIG. 19 illustrates a perspective view of a modified embodiment of the LGA interposer array, relative to that shown in FIG. 17.
Figure 20:
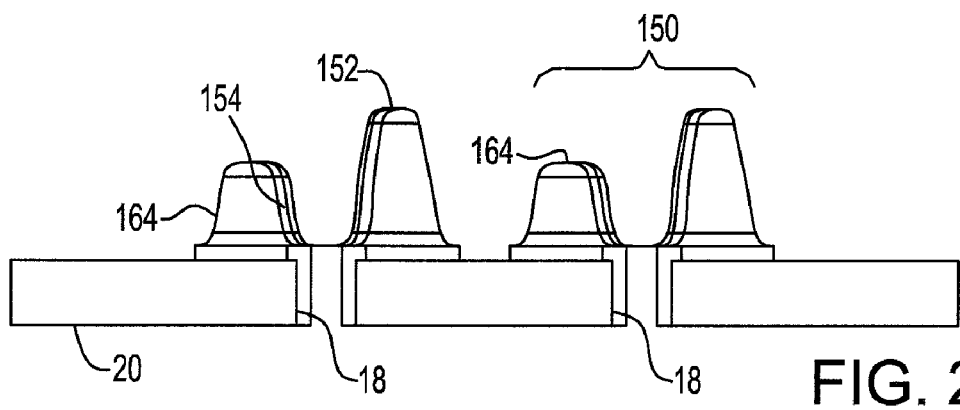
FIG. 20 illustrates a transverse enlarged cross-sectional view of a portion of the LGA interposer array of FIG. 19.

Reverting to the embodiment of FIGS. 19 and 20 of the drawings, which is quite similar to the embodiment of FIGS. 17 and 18, in that instance, the primary distinction resides in that at least one or two of the LGA interposer buttons 152 of a respective group thereof has or have a height which differs from the remaining interposer buttons of that group. For example, two or more buttons 152 of each group may be taller than the remaining buttons 164 of that group (of four buttons) in order to essentially create a lateral stop mechanism for a side loading of a module, through such groupings of LGA interposer buttons in respective arrays. In essence, the different heights in the LGA interposer button groups enable a module with an associated solder ball to be brought into contact and aligned by means of lateral insertion, rather than only vertical insertion, wherein the higher LGA interposer buttons provide stops for the solder balls in order to register with the essentially hemi-toroidally shaped elastomeric contacts.

Figure 21:
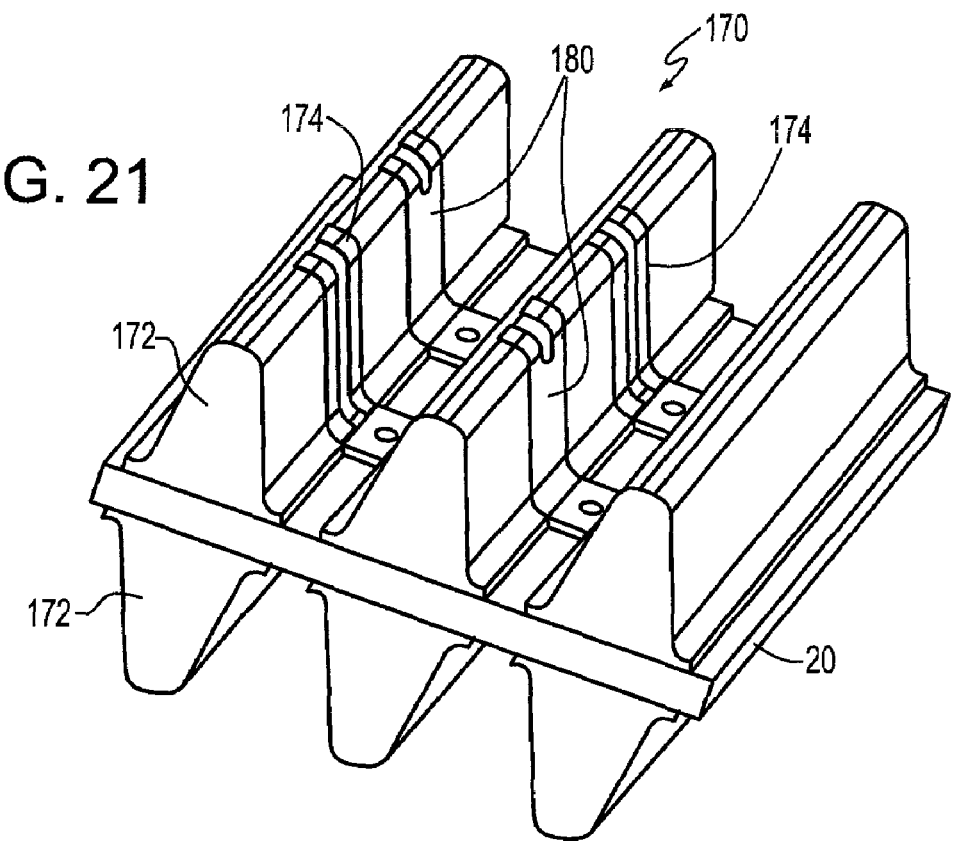
FIG. 21 illustrates a modified arrangement consisting of linear bars of metal-on-elastomer contacts shown in a perspective representation.
Figure 22:
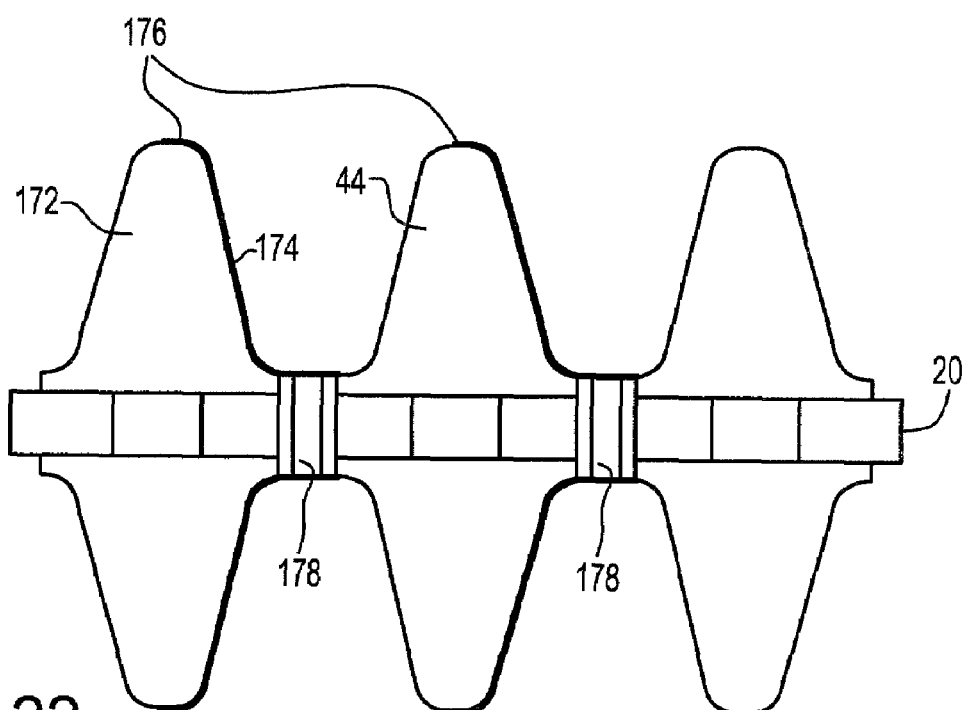
FIG. 22 illustrates a transverse enlarged cross-sectional view of a portion of the LGA interposer arrangement of FIG. 21.

Reverting to the embodiment of FIGS. 21 and 22 of the drawings, in this instance, there is provided an LGA interposer array 170 arranged on an insulating carrier plane 20, wherein multiple points of contact for each I/O are provided by means of linear bars of elastomeric LGA interposers 172. This provides a compliant structure on which a plurality of spaced metallic electrical contact strip elements 174 may be positioned so as to extend from the top 176 of each respective interposer bar 172 both above and below the insulating carrier plane 20, as shown in FIG. 22, into electrically sleeve-like conductive vias 178 formed extending through the insulating carrier plane 20 in contact with respective metal strip contacts 180 above and below the insulating carrier plane 20. In that instance, the metal contact strips 180 may be formed with different shapes, such as one typical contact joining from two separate ships 182 into a single common strip 184 near the top, as clearly illustrated in FIG. 21, or joining further down near the via extending through the carrier plane to the other side. Furthermore, three or more contact points for each I/O may be provided and different types of contact elements may be utilized along the bar whereby some types may be more suitable for conduction of signals and others for high amperage power feeds.

Figures 23, 24, 25:
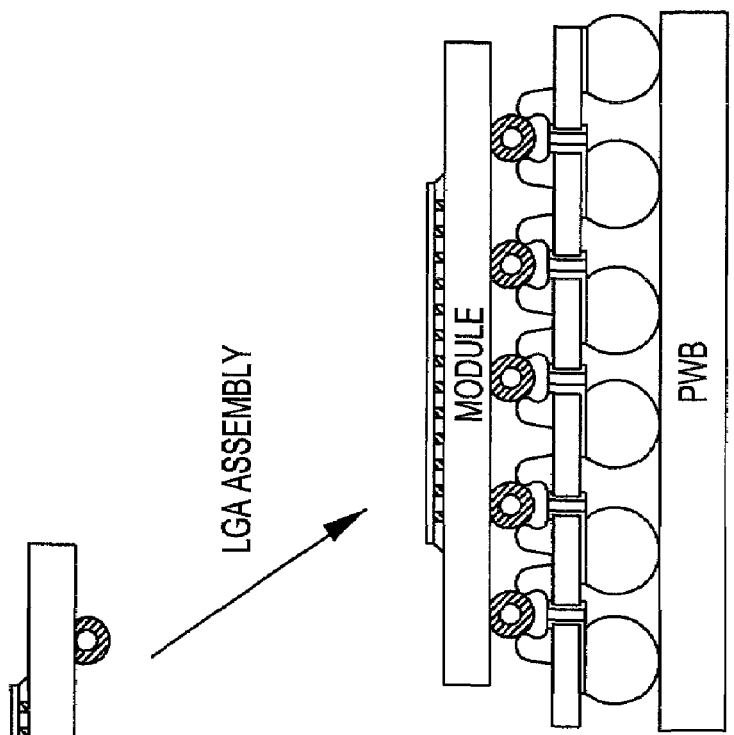
FIGS. 23-25 illustrate, respectively, alternative-processing concepts for providing the LGA interposer arrays in accordance with various of the embodiments described hereinabove.

As illustrated in FIGS. 23-25, there are shown alternate process flows for a balled module, wherein a balled module zoo, as shown in FIG. 23, can be directed either towards a solder reflow line for normal BGA connection to a PWB, as illustrated in FIG. 24, or alternatively, to an LGA interposer assembly 210 where it is assembled by means of a hemi-toroidal LGA and PWB (wiring board) under pressure to make a field replaceable unit, as shown in FIG. 25 of the drawings.

With regard to the configurations of the LGA interposer buttons, these may be of elastic structural members, which are conical, dome-shaped conic sections or other positive release shapes, such as roughly cylindrical or hemispherical, hemi-toroids, and wherein the metal coating forming the electrically conductive contact members or strips terminate at the apices of each of the multiple buttons.

Moreover, the elastomeric material, which is utilized for each of the LGA interposer buttons or for the linear shaped elastic structural member (as shown in FIGS. 21 and 22) may be constituted of any suitable molded polymer from any rubber-like moldable composition, which, for example, among others, may consist of silicon rubber, also known as siloxane or PDMS, polyurethane, polybutadiene and its copolymers, polystyrene and its copolymers, acrylonitrile and its copolymers and epoxies and its copolymers.

The connectors of the inventive LGA structure may be injection molded or transfer molded onto an insulating carrier plane 20, and may serve the purpose of mechanically anchoring the contact to the insulating carrier plane and in instances can provide a conduit for the electrical connections which pass from the top surface of the connector to the bottom surface thereof.

In addition to connecting chip modules to printed circuit boards, the arrays of the LGA interposer buttons or linear structure may be employed for chip-to-chip connection in chip stacking or for board to board connections, the contacts may be of any shape and produced by injecting the elastomer in the same side as where the elastomer contact will be anchored to the insulating carrier by a hole or holes or vias, which extend through the insulating carrier or by any cavity edge formed into the surface of the insulating carrier.

In essence, the molding of the elastomeric material component or components, such as the hemi-toroidal interposer or interposers may be implemented in that the elastomeric polymer material is ejected from the same side at which the interposer will be positioned on the insulating carrier plane, and will be anchored to the insulating carrier plane by means of a hole or holes, as illustrated in the drawings, which either extend completely through to the opposite side of the insulating carrier plane, or through the intermediary of a cavity which is etched or formed into the surface of the insulating carrier plane, which does not extend all the way through the thickness thereof, and wherein any cavity may have flared undercut sidewalls from maximum anchoring ability or by simple surface roughening of the insulating carrier plane. This is clearly illustrated in the embodiments represented in FIGS. 15 and 16 of the drawings.

While the present invention has been particularly shown and described with respect to preferred embodiments thereof, it will be understood by those skilled in the art that the foregoing and other changes in forms and details may be made without departing from the scope and spirit of the present invention. It is therefore intended that the present invention not be limited to the exact forms and details described and illustrated, but fall within the scope of the appended claims.

What is claimed is:

1. A land grid array (LGA) interposer structure, comprising an electrically insulating carrier plane, at least one interposer mounted on a first surface of said carrier plane, said interposer selectively having a hemi-toroidal, conical, dome-shaped conic section, generally cylindrical or hemi-spherical configuration in transverse cross-section and being constituted of a dielectric elastomeric material; a plurality of electrically-conductive elements being arranged about the surface of said at least one hemi-toroidal interposer and extending radially inwardly and downwardly from an uppermost end thereof into electrical contact with at least one component located on an opposite side of said electrically insulating carrier plane, said electrically-insulating carrier plane having at least one through-extending via formed therein, an electrically conductive pad extending through said at least one via and having portions in surface contact with upper and lower surfaces of said insulating carrier plane, said electrically-conductive elements comprising metallic strips extending into electrical contact with the pad portion on the upper surface of said pad, and the at least one component on the opposite side of said insulating carrier plane being a solder ball attached to the lower surface of said pad and forming an electrically-conductive contact with the pad portion on the lower surface of said electrically-insulating carrier plane.

2. An interposer structure as claimed in claim 1, wherein an array of said interposers and solder balls are provided in contact with respectively, the upper and lower surfaces of said electrically-conductive, and said pad portion, are distributed over the surface of said insulating carrier plane.

3. An interposer structure as claimed in claim 1, wherein said at least one interposer is constituted of a dielectric elastomeric material.

4. An interposer structure as claimed in claim 3, wherein said elastomeric material comprises a moldable polymer having rubber-like resilient characteristics.

5. An interposer structure as claimed in claim 4, wherein said polymer is selected from the group of materials consisting of silicon rubber, siloxane, PDMS, polyurethane, polybutadiene and copolymers thereof, polystyrene and copolymers thereof, acrylonitrile and copolymers thereof, and epoxides and copolymers thereof.

* * * * *